US011619518B2

(12) United States Patent
Wu et al.

(10) Patent No.: US 11,619,518 B2
(45) Date of Patent: Apr. 4, 2023

(54) SYSTEM AND METHOD OF DIRECTIONAL SENSOR CALIBRATION

(71) Applicant: Bench Tree Group, LLC, Georgetown, TX (US)

(72) Inventors: Jian-Qun Wu, Kingwood, TX (US); James-Christian F. Ang, Hutto, TX (US); Lee Jacobo Jose Roitberg, Austin, TX (US)

(73) Assignee: Bench Tree Group, LLC, Georgetown, TX (US)

( * ) Notice: Subject to any disclaimer, the term of this patent is extended or adjusted under 35 U.S.C. 154(b) by 0 days.

(21) Appl. No.: 17/121,032

(22) Filed: Dec. 14, 2020

(65) Prior Publication Data

US 2021/0262827 A1      Aug. 26, 2021

Related U.S. Application Data

(63) Continuation of application No. 15/862,198, filed on Jan. 4, 2018, now Pat. No. 10,866,116, which is a
(Continued)

(51) Int. Cl.
*G01C 25/00* (2006.01)
*G01R 35/00* (2006.01)
(Continued)

(52) U.S. Cl.
CPC .......... *G01C 25/005* (2013.01); *E21B 47/022* (2013.01); *G01C 17/38* (2013.01); *G01R 35/005* (2013.01)

(58) Field of Classification Search
CPC ..... E21B 47/022; G01C 17/38; G01C 25/005; G01R 35/005
(Continued)

(56) References Cited

U.S. PATENT DOCUMENTS

| 6,966,211 | B2 | 11/2005 | Wu |
| 7,275,008 | B2 | 9/2007 | Plyvanainen |
| 10,866,116 | B2 * | 12/2020 | Wu ...................... G01C 25/005 |
| 2004/0149004 | A1 | 8/2004 | Wu |

(Continued)

FOREIGN PATENT DOCUMENTS

WO     WO 99-64720      12/1999

OTHER PUBLICATIONS

R. Estes and P. Walters, Improvement of Azimuth Accuracy by Use of Iterative Total Field Calibration Technique and Compensation for System Environment Effects: SPE Article 19546. 64$^{th}$ Annual Technical Conference, Oct. 1989.
(Continued)

*Primary Examiner* — John H Le
(74) *Attorney, Agent, or Firm* — Dunlap Codding, P.C.

(57) ABSTRACT

An improved total field calibration system and method is disclosed for reducing the rotational misalignment between magnetic and gravity sensors in a directional sensing system. A method of calibrating a tri-axial directional sensor comprising orthonormal accelerometers and orthonormal magnetometers, comprises measuring Earth's magnetic and gravity fields with said directional sensor in at least 4 sensor orientations; obtaining at least one reference field value of dip drift of Earth's magnetic field from at least one source independent of said directional sensor corresponding to said orientations; and, determining and applying rotational misalignments between said magnetometers and said accelerometers so that measured magnetic dip drifts are substantially equal to said reference values. The calibration process can be performed without monitoring the declination change during the calibration process. Directional sensing systems can be calibrated accurately during a period when the Earth's magnetic field changes rapidly.

17 Claims, 5 Drawing Sheets

Related U.S. Application Data continuation of application No. 14/991,726, filed on Jan. 8, 2016, now Pat. No. 9,863,785, which is a continuation of application No. 14/572,569, filed on Dec. 16, 2014, now Pat. No. 9,250,100.

(60) Provisional application No. 61/917,855, filed on Dec. 18, 2013.

(51) Int. Cl.
*G01C 17/38* (2006.01)
*E21B 47/022* (2012.01)

(58) Field of Classification Search
USPC .......................................................... 702/92
See application file for complete search history.

(56) References Cited

U.S. PATENT DOCUMENTS

| | | |
|---|---|---|
| 2005/0150689 A1 | 7/2005 | Jogi et al. |
| 2013/0002257 A1 | 1/2013 | Mcelhinney et al. |
| 2013/0292176 A1 | 11/2013 | Gyrodata |

OTHER PUBLICATIONS

P. Graven, and T. Kenny, Laboratory (and on-orbit) magnetometer calibration without coil facilities or orientation information: Proceedings of the Tenth Annual AIAA/USU Small Satellite Conference, Sep. 16-19, 1996.

PCT/US2014/070576 International Search Report and Written Opinion of the International Searching Authority, dated Apr. 28, 2015, 25 pgs.

\* cited by examiner

SYSTEM AND METHOD OF DIRECTIONAL SENSOR CALIBRATION

CROSS-REFERENCE TO RELATED APPLICATIONS

This application is a continuation of U.S. application Ser. No. 15/862,198, filed on Jan. 14, 2018, which is a continuation of U.S. application Ser. No. 14/991,726, filed on Jan. 8, 2016 which is a continuation of U.S. application Ser. No. 14/572,569, filed on Dec. 16, 2014, which claims priority to U.S. Provisional Application Ser. No. 61/917,855 filed on Dec. 18, 2013, the entire contents of all of which are hereby expressly incorporated herein by reference.

BACKGROUND

Measurement While Drilling (MWD) directional sensors may be used to determine the orientation of wells during drilling operations. The MWD directional sensor may be packaged in a section of a drilling string near a drill bit.

Generally, a MWD directional sensor may include multiple magnetometers and accelerometers. The magnetometers may be used to measure components of the Earth's magnetic field (i.e., geomagnetic field) along three orthogonal axes related to the drill string section where the MWD directional sensor is located. These axes form the directional sensor frame. The Earth's gravity components along the same axes may be measured by the accelerometer. An accelerometer at rest on Earth measures along its axis the acceleration due to gravity. This acceleration component is same in magnitude as that of gravity but opposite in sign. The measurements of the magnetic and gravity field vectors at a survey point in a well may then be used to derive the orientation of the drill string and the well.

Generally, the measurement axes of magnetometers and accelerometers may be made to substantially align with each other, and used as axes of the directional sensor frame. The three accelerometers measure the Earth's gravity components along the mutually orthogonal X, Y, and Z-directions, where Z is along the drill string axis and X is nominally aligned with the hardware x-accelerometer. The magnetometers provide magnetic field components along the same axes (i.e., Z is along the drill string axis and X is nominally aligned with the hardware x-accelerometer). These three directions are the axes of the directional sensor frame.

Misalignments between the hardware axes and the directional sensor frame may be determined through a calibration process. In addition to misalignments, scale factor and bias of each field component sensor may also be determined from the calibration process.

The calibration parameters are known as calibration coefficients. The collection of all of the coefficients is called a calibration matrix. In operation, calibration coefficients are applied to hardware sensor outputs to obtain magnetic and gravitational field components along axes of the directional sensor frame.

In the current art, calibration is often determined using the magnitudes of Earth's magnetic field and gravitational field. Such techniques are known as the Total Field Calibration (TFC) methods. These techniques, however, may only be effective for calibration when the geomagnetic field is stable. As such, the current TFC calibration methods may be inaccurate if the geomagnetic field is changing.

BRIEF DESCRIPTION OF THE SEVERAL VIEWS OF THE DRAWINGS

To assist those of ordinary skill in the relevant art in making and using the subject matter hereof, reference is made to the appended drawings, which are not intended to be drawn to scale, and in which like reference numerals are intended to refer to similar elements for consistency. For purposes of clarity, not every component may be labeled in every drawing.

DETAILED DESCRIPTION

Figure 1:
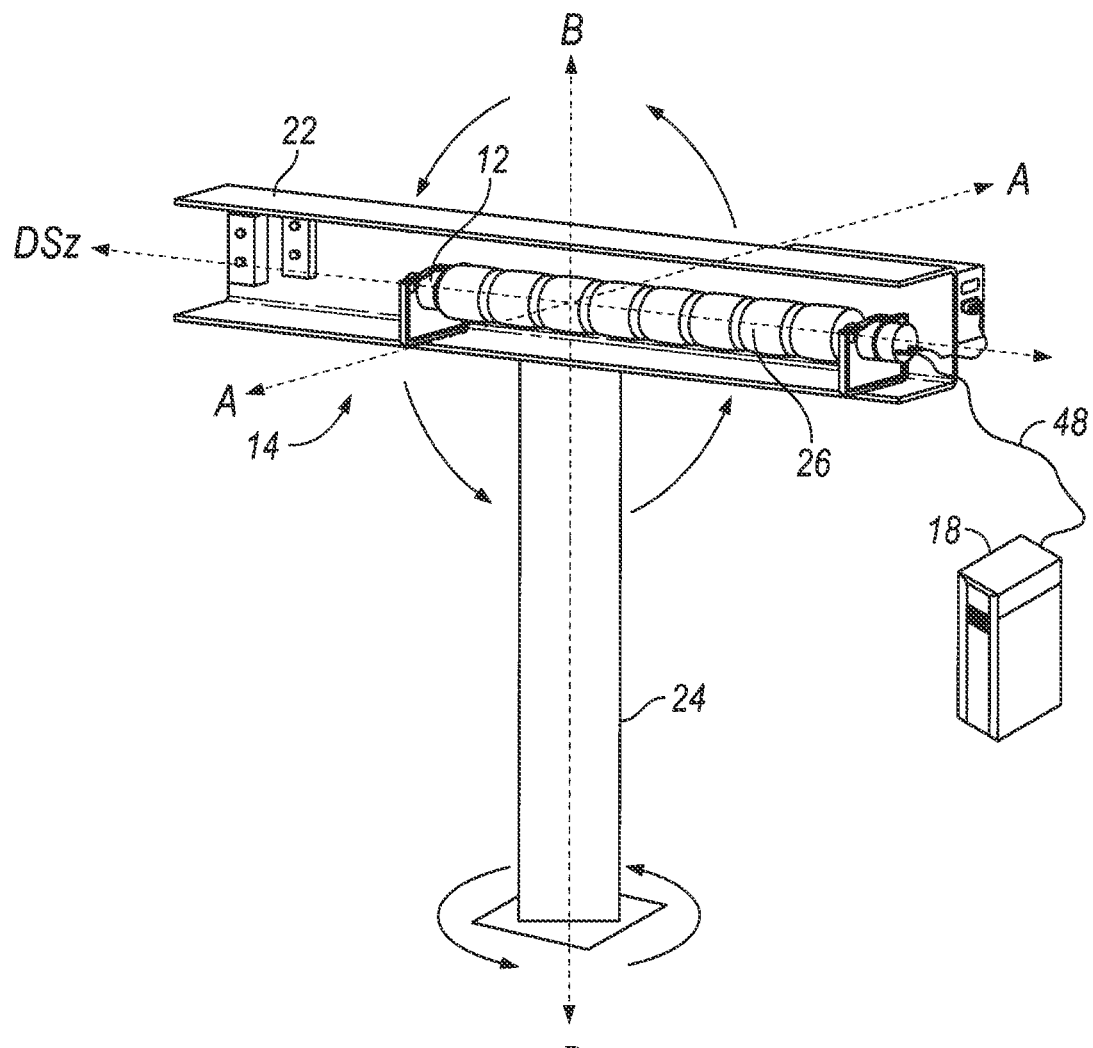
FIG. 1 illustrates a schematic diagram of an exemplary embodiment of an apparatus for calibrating a directional sensor in accordance with the present disclosure.

Before explaining at least one embodiment of the disclosure in detail, it is to be understood that the disclosure is not limited in its application to the details of construction, experiments, exemplary data, and/or the arrangement of the components set forth in the following description or illustrated in the drawings unless otherwise noted.

The disclosure is capable of other embodiments or of being practiced or carried out in various ways. Also, it is to be understood that the phraseology and terminology employed herein is for purposes of description, and should not be regarded as limiting.

The following detailed description refers to the accompanying drawings. The same reference numbers in different drawings may identify the same or similar elements.

As used in the description herein, the terms "comprises," "comprising," "includes," "including," "has," "having," or any other variations thereof, are intended to cover a non-exclusive inclusion. For example, unless otherwise noted, a process, method, article, or apparatus that comprises a list of elements is not necessarily limited to only those elements, but may also include other elements not expressly listed or inherent to such process, method, article, or apparatus.

As used in the instant disclosure, the terms "provide", "providing", and variations thereof comprise displaying or providing for display a webpage (e.g., directional drilling monitoring and/or calibrating webpage), electronic communications, e-mail, and/or electronic correspondence to one or more user terminals interfacing with a computer and/or computer network(s) and/or allowing the one or more user terminal(s) to participate, such as by interacting with one or more mechanisms on a webpage (e.g., directional drilling monitoring and/or calibrating webpage), electronic communications, e-mail, and/or electronic correspondence by sending and/or receiving signals (e.g., digital, optical, and/or the like) via a computer network interface (e.g., Ethernet port, TCP/IP port, optical port, cable modem, combinations thereof, and/or the like). A user may be provided with a web page in a web browser, or in a software application, for example.

Further, unless expressly stated to the contrary, "or" refers to an inclusive and not to an exclusive "or". For example, a condition A or B is satisfied by one of the following: A is true (or present) and B is false (or not present), A is false (or not present) and B is true (or present), and both A and B are true (or present).

In addition, use of the "a" or "an" are employed to describe elements and components of the embodiments herein. This is done merely for convenience and to give a general sense of the inventive concept. This description should be read to include one or more, and the singular also includes the plural unless it is obvious that it is meant otherwise. Further, use of the term "plurality" is meant to convey "more than one" unless expressly stated to the contrary.

As used herein, any reference to "one embodiment," "an embodiment," "some embodiments," "one example," "for example," or "an example" means that a particular element, feature, structure or characteristic described in connection with the embodiment is included in at least one embodiment. The appearance of the phrase "in some embodiments" or "one example" in various places in the specification is not necessarily all referring to the same embodiment, for example.

Circuitry, as used herein, may be analog and/or digital components, or one or more suitably programmed processors (e.g., microprocessors) and associated hardware and software, or hardwired logic. Also, "components" may perform one or more functions. The term "component," may include hardware, such as a processor (e.g., microprocessor), an application specific integrated circuit (ASIC), field programmable gate array (FPGA), a combination of hardware and software, and/or the like.

Software may include one or more computer readable instructions that when executed by one or more components cause the component to perform a specified function. It should be understood that the algorithms described herein may be stored on one or more non-transient memory. Exemplary non-transient memory may include random access memory, read only memory, flash memory, and/or the like. Such non-transient memory may be electrically based, optically based, and/or the like.

It is to be further understood that, as used herein, the term user is not limited to a human being, and may comprise, a computer, a server, a website, a processor, a network interface, a human, a user terminal, a virtual computer, combinations thereof, and the like, for example.

Figure 2:
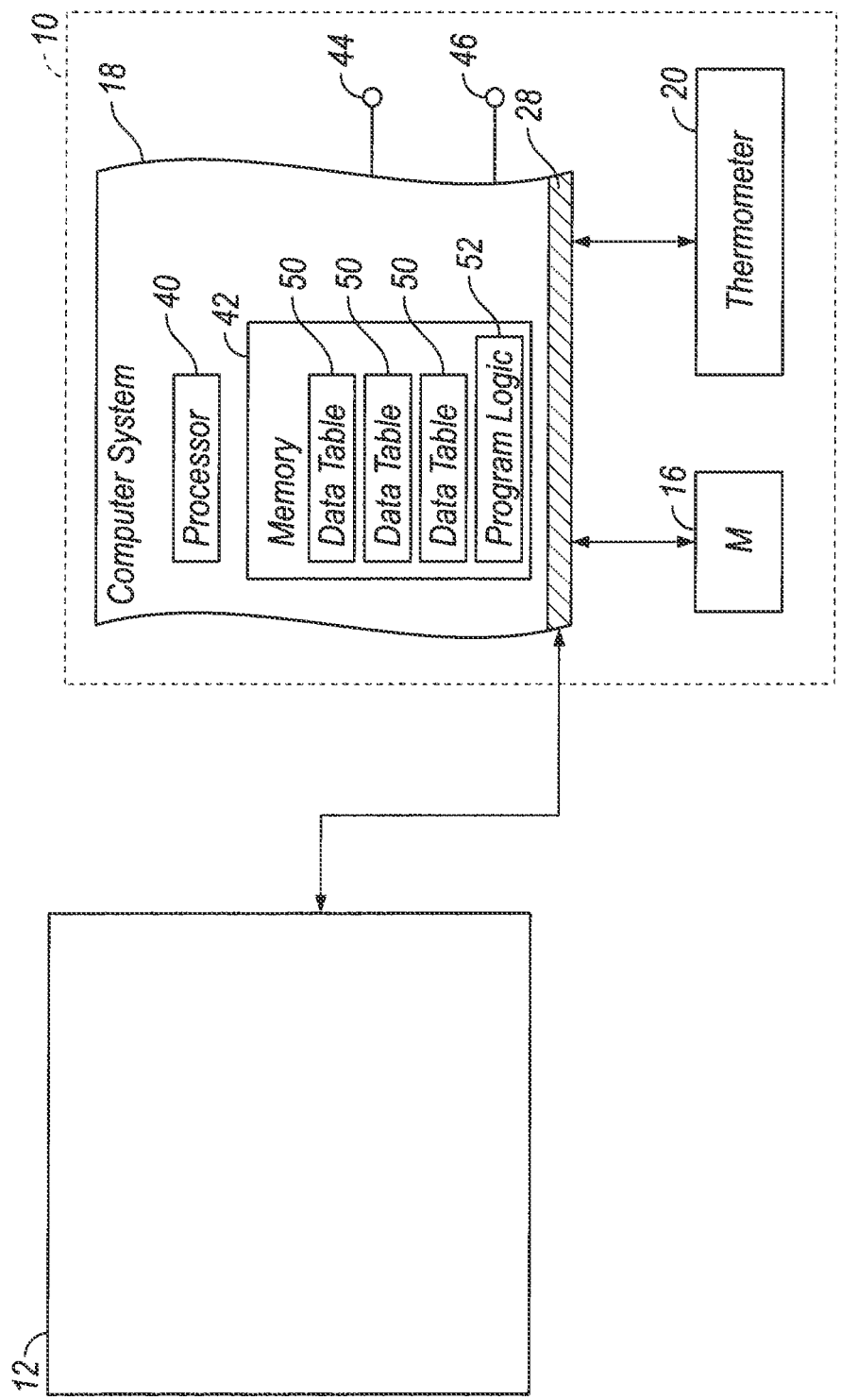
FIG. 2 illustrates a block diagram of the exemplary embodiment of the apparatus for calibrating the directional sensor illustrated in FIG. 1.

Referring now to the Figures, and in particular to FIGS. 1 and 2, shown therein are illustrations of hardware forming an exemplary embodiment of an apparatus 10 for calibrating a directional sensor 12 above the ground. The apparatus 10 may include one or more magnetometer systems 16 and a computer system 18. It is not part of the directional sensor system 12 under calibration and is used for providing reference values for the calibration of directional sensors. The one or more magnetometer systems 16 may measure the magnitude, magnetic dip and/or magnetic dip drift of the Earth's magnetic field. In some embodiments, the apparatus 10 may additionally include a calibration stand 14, and a thermometer 20 as illustrated in FIG. 2.

Generally, calibration of the directional sensor 12 may occur while the directional sensor 12 may be positioned in the calibration stand 14. The calibration stand 14 may include a housing 22 capable of holding and/or orienting the directional sensor 12 in multiple directions about an axis A. For example, the housing 22 may be capable of rotational movement about the axis A such that the directional sensor 12 may be oriented in any direction within 360 degrees about the axis A.

The housing 22 may be attached to a platform 24. The platform 24 may be capable of movement in multiple directions about an axis B. For example, the platform 24 may be capable of rotation about the axis B such that the directional sensor 12 may be oriented in any direction about the axis B. The housing 22 may have mechanical structures which allow the rotation of the sensor about its cylindrical axis.

In some embodiments, the calibration stand 14 may include a temperature applicator 26. The temperature applicator 26 may be capable of increasing and/or decreasing the temperature of the directional sensor 12. For example, in some embodiments, the temperature applicator 26 may be a temperature blanket surrounding the directional sensor 12 and capable of increasing the temperature of the directional sensor 12.

In some embodiments, the temperature applicator 26 may include the thermometer 20 such that the temperature applicator 26 may be capable of increasing the temperature of the directional sensor 12, and also be capable of measuring the temperature of the directional sensor 12. In some embodiments, the temperature applicator 26 and the thermometer 20 may be separate devices. For example, in some embodiments, the thermometer 20 may be a separate device positioned in proximity to or within the directional sensor 12. More than one thermometer, including those of the directional sensor, may be used to monitor the uniformity of the temperature.

The magnetometer system 16 may be capable of measuring the magnitude of the Earth's magnetic field, magnetic dip, and/or magnetic dip drift. This system is used to acquire reference values, and is not part of the directional sensor system to be calibrated. For example, in some embodiments the magnetometer system 16 is only required to measure the magnitude of the Earth's magnetic field. In some embodiments, the magnetometer system 16 may be capable of measuring the magnetic dip drift of the Earth's magnetic field. In some embodiments, the magnetometer system 16 may include a single device for measuring the Earth's magnetic field including magnitude, magnetic dip and/or magnetic dip drift. In some embodiments, the magnetometer system 16 may include two or more devices for measuring the Earth's magnetic field including magnitude, magnetic dip and/or magnetic dip drift. For example, in some embodiments, the magnetometer system 16 may include a first magnetometer for measuring magnitude of the Earth's magnetic field and a second magnetometer for measuring magnetic dip and/or magnetic dip drift. It should be noted that with the use of multiple magnetometers in the magnetometer system 16, each magnetometer of the magnetometer system 16 may be positioned in a single housing or separate housing. Additionally, each magnetometer of the magnetometer system 16 may be positioned in the same physical location or different physical locations. Commercially available magnetometers can be used for the magnetometer system 16, such as a "Suspended didD" magnetometer available from Gem Systems, Inc. of Markham Ontario, Canada.

One or more I/O ports 28 may transmit data to and from the computer system 18 to the directional sensors 12, temperature applicator 26, and/or thermometer 20. The one or more I/O ports 28 may be one or more physical and/or virtual ports.

Figure 3:
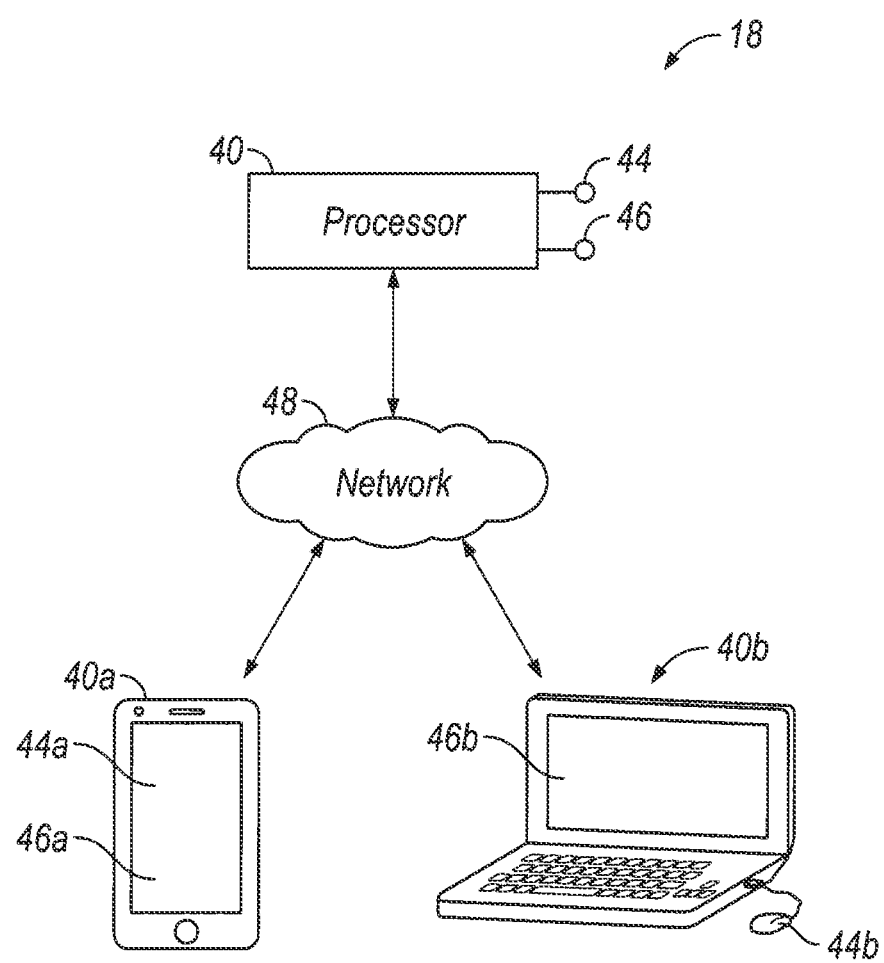
FIG. 3 illustrates a block diagram of the exemplary computer system within the apparatus for calibrating the directional sensor illustrated in FIG. 1.

Referring to FIGS. 2 and 3, the computer system 18 may be a system or systems that are able to embody and/or execute the logic of the processes described herein. Logic embodied in the form of software instructions and/or firmware may be executed on any appropriate hardware. For example, logic embodied in the form of software instructions and/or firmware may be executed on dedicated system or systems, on a personal computer system, on a distributed processing computer system, and/or the like. In some embodiments, logic may be implemented in a stand-alone environment operating on a single computer system and/or logic may be implemented in a networked environment such as a distributed system using multiple computers and/or processors.

The computer system 18 may include one or more processors 40 working together, or independently to, execute processor executable code, one or more memories 42 capable of storing processor executable code, one or more input devices 44, and one or more output devices 46.

Each element of the computer system 18 may be partially or completely network-based or cloud based, and may or may not be located in a single physical location. In some embodiments, the one or more processors 40 may communicate with the directional sensor 12, calibration stand 14, magnetometer system 16, and/or thermometers 20 via a network 48 and function to determine and upload calibration information to the directional sensor 12 as discussed below.

In some embodiments, the measurement axes of magnetometers and accelerometers of directional sensors 12 are usually made to align perfectly with each other and are used as those of the directional sensor frame. In other embodiments, the measurement axes of magnetometers and accelerometers may be offset. If the three sets of axes are not aligned and the relative orientations among the three frames are known, then one can always transform a vector in one frame into that of another frame. For simplicity such sensor systems are not explicitly described herein, however, as one skilled in the art will appreciate, the present disclosure may be applied to such sensor systems. It is therefore assumed that three accelerometers measure Earth's gravity components along the mutually orthogonal X, Y, and Z directions where Z is along the drill string axis and X is aligned with the hardware x accelerometer. The magnetometers may acquire magnetic field components along the same axes. The three directions may be the axes of the directional sensor frame.

The hardware axes of magnetometers and accelerometers are usually made to substantially align with the measurement axes, namely the axes of the directional sensor frame. The misalignments between the hardware axes and those of the directional sensor frame are determined through a calibration process. In addition to misalignments, scale factor and bias of each field component sensor are also determined from the calibration process.

For engineering reasons the hardware axes in some of the sensor systems are not aligned with those of the directional sensor frame by design. Some transformation is performed on the sensor output data to convert them into those from axes nominally aligned with the directional sensor frame. For simplicity, such sensor systems are not explicitly discussed in detail in this invention disclosure. It should be understood that this invention applies to such systems also.

Misalignments consist of two parts. The hardware axes not being orthogonal to each other are called orthogonal misalignments. Rotational misalignments are the mismatch between two orthogonal frames. In calibration processes the two parts may be determined in sequence in two steps. The sum of two types of misalignments is corrected by the misalignment part of the calibration matrix in a single step.

For linear sensors such as fluxgate magnetometers, the effects of linear electronic cross axis interferences or cross talks are the same as the hardware sensors not being orthogonal. The orthogonal misalignment, therefore, can come from the hardware axes not being at right angles to each other geometrically and/or electronic cross axis interference. A calibration process may not make a distinction between the two and the total effect plus that of the rotational misalignment is parameterized by a single set of misalignment coefficients.

Calibration coefficients are functions of temperature. They are determined at various temperatures. An interpolation method is then used to parameterize the temperature dependence of each coefficient.

At a given temperature the hardware x, y, and z sensor outputs of the magnetometers $\vec{V}=(V_x, V_y, V_z)$ are converted into magnetic field in the directional sensor frame $\vec{B}=(B_x, B_y, B_z)$ by the following equation:

$$\begin{pmatrix} B_x \\ B_y \\ B_z \end{pmatrix} = \begin{bmatrix} m_{xx} & m_{xy} & m_{xz} \\ m_{yx} & m_{yy} & m_{yz} \\ m_{zx} & m_{zy} & m_{zz} \end{bmatrix} \left\{ \begin{pmatrix} V_x \\ V_y \\ V_z \end{pmatrix} - \begin{pmatrix} V_{0x} \\ V_{0y} \\ V_{0z} \end{pmatrix} \right\}, \quad (1)$$

where $$M = \begin{bmatrix} m_{xx} & m_{xy} & m_{xz} \\ m_{yx} & m_{yy} & m_{yz} \\ m_{zx} & m_{zy} & m_{zz} \end{bmatrix} \quad (2)$$

is the matrix for scale factors and misalignments and $$\vec{V}_0 = (V_{0x}, V_{0y}, V_{0z}) \quad (3)$$

are the biases.

There are many ways to represent the calibration coefficients. A representation may result in a conversion equation different in form than that of equation (1). The definitions of the parameters are thus different from those of equation (1). But any representation can be transformed into that of equation (1). For example, in Wu, U.S. Pat. No. 6,966,211, which is hereby incorporated by reference in its entirety, the magnetic field is obtained by $$\begin{pmatrix} B_x \\ B_y \\ B_z \end{pmatrix} = \begin{bmatrix} 1 & \tilde{m}_{xy} & \tilde{m}_{xz} \\ \tilde{m}_{yx} & 1 & \tilde{m}_{yz} \\ \tilde{m}_{zx} & \tilde{m}_{zy} & 1 \end{bmatrix} \left\{ \begin{bmatrix} 1/s_x & 0 & 0 \\ 0 & 1/s_y & 0 \\ 0 & 0 & 1/s_z \end{bmatrix} \begin{pmatrix} V_x \\ V_y \\ V_z \end{pmatrix} - \begin{pmatrix} B_{0x} \\ B_{0y} \\ B_{0z} \end{pmatrix} \right\}, \quad (4)$$

where s's are scale-factors, $\tilde{m}$'s are misalignment parameters, and $B_0$'s are biases. There are 12 coefficients in equations (1) and (4), respectively. The two sets of coefficients are related to each other by the following two equations:

$$\begin{bmatrix} m_{xx} & m_{xy} & m_{xz} \\ m_{yx} & m_{yy} & m_{yz} \\ m_{zx} & m_{zy} & m_{zz} \end{bmatrix} = \begin{bmatrix} 1 & \tilde{m}_{xy} & \tilde{m}_{xz} \\ \tilde{m}_{yx} & 1 & \tilde{m}_{yz} \\ \tilde{m}_{zx} & \tilde{m}_{zy} & 1 \end{bmatrix} \begin{bmatrix} 1/s_x & 0 & 0 \\ 0 & 1/s_y & 0 \\ 0 & 0 & 1/s_z \end{bmatrix}; \quad (5)$$

$$\begin{pmatrix} V_{0x} \\ V_{0y} \\ V_{0z} \end{pmatrix} = \begin{bmatrix} m_{xx} & m_{xy} & m_{xz} \\ m_{yx} & m_{yy} & m_{yz} \\ m_{zx} & m_{zy} & m_{zz} \end{bmatrix}^{-1} \begin{bmatrix} 1 & \tilde{m}_{xy} & \tilde{m}_{xz} \\ \tilde{m}_{yx} & 1 & \tilde{m}_{yz} \\ \tilde{m}_{zx} & \tilde{m}_{zy} & 1 \end{bmatrix} \begin{pmatrix} B_{0x} \\ B_{0y} \\ B_{0z} \end{pmatrix}. \quad (6)$$

Therefore using equation (1) for calibration coefficient definitions and their applications in this disclosure does not restrict the scope of this disclosure.

The matrix M can be factored into a product of two 3×3 matrices, $$M=RL, \qquad (7)$$

where R is a pure rotational matrix with three independent parameters and L is a matrix with six independent parameters. The nine independent parameters in M are separated into groups of three and six. The factoring does not increase the complexity. Rather it separates two groups of parameters so that they can be separately determined. The equation (1) can be rewritten in a matrix form, $$\vec{B}=RL\{\vec{V}-\vec{V}_0\} \qquad (8)$$

Different factorings may lead to the same M. Furthermore, in some embodiments, M may not be factored explicitly in a calibration method. The nine parameters in M are, however, implicitly separated into the two groups. Without a loss of generality L is assumed to be a lower diagonal matrix with six independent parameters. Together with the bias vector $\vec{V}_0$ L transforms the hardware magnetometer output $\vec{V}$ into a magnetic field vector $\vec{B}_{or}$ in an orthonormal frame by $$\vec{B}_{or}=L\{\vec{V}-\vec{V}_0\}. \qquad (9)$$

An orthonormal frame is defined to be a frame where the orthogonal misalignments, scale factor errors, and biases of the field component sensors have been corrected.

The rotational matrix R with three independent parameters then rotates $\vec{B}_{or}$ into the magnetic field in the directional sensor frame by $$\vec{B}=R\vec{B}_{or}. \qquad (10)$$

Figure 4:
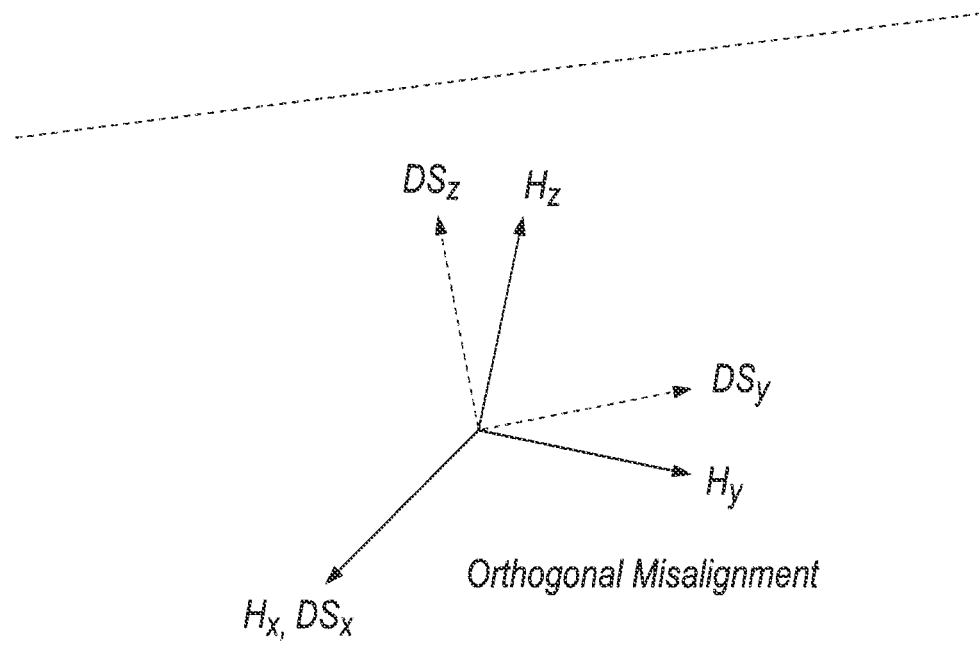
FIG. 4 illustrates a diagrammatic view of orthogonal misalignment between hardware axes of sensors within a directional sensor system and axes of the directional sensor system.

The freedom in the way M is factored is related to the orientation of the orthogonal frame. The lower diagonal matrix for L corresponds to an orthogonal frame where the hardware x axis is the x of the orthogonal frame. y is in the x-y plane of the hardware. FIG. 4 shows the graphical relationship between the hardware (x, y, z) and those of the orthogonal frame corresponding to L being lower diagonal.

The gravity measurements in the directional sensor frame can be related to accelerometer hardware sensor outputs through equations identical in form to those above.

Applying the total field magnitude constraint at each directional sensor orientation for several orientations can be used to determine the calibration coefficients without accurate sensor stands or precise sensor orientations for data acquisitions. An iterative method is described In R. Estes and P. Walters, Improvement of Azimuth Accuracy by Use of Iterative Total Field Calibration Technique and Compensation for System Environment Effects: SPE Article 19546, 64th Annual Technical Conference, October 1989, which is hereby incorporated by reference in its entirety. This calibration technique, and others similar to it, is called the Total Field Calibration (TFC) method.

A current state of art TFC method consists of steps of:
(1) Obtain raw sensor outputs at multiple orientations by rotating sensor assembly around axes near its hardware x, y, and z axes;
(2) The magnitudes of the Earth's magnetic field are measured by an independent device at the same time when sensor measurements are taken;
(3) Nine parameters in L and vector $\vec{V}_0$ for magnetometers are determined by finding their values so that the magnitude from the sensor measurements at each orientation matches that of the reference for all orientations.
(4) Nine parameters in L and vector $\vec{V}_0$ for accelerometers are determined in a similar fashion where the reference value is a constant;
(5) Two parameters for the orientation of the Z-axis of the directional sensor frame in the orthonormal accelerometer frame is determined by equations (13) and (14) of Estes et al which are the results of requiring the calibrated accelerometer z-components at two sets of two orientations to be constant within each set;
(6) X-axis of the directional sensor frame is chosen to be in the plane of Z-axis of step (4) and hardware x accelerometer and is nearest to x accelerometer. Namely $M_{xy}$ is set to be zero;
(7) Two parameters for the orientation of the z-axis of the directional sensor frame in the orthonormal magnetometer frame is determined by equations (13) and (14) of Estes et al which are the results of requiring the calibrated magnetometer z-components at two sets of two orientations to be constant within each set;
(8) The azimuthal orientation of the magnetometer X axis is determined by requiring the magnetic dip to be as constant as possible for some or all orientations.

There are several deficiencies in the current TFC method. In step (5) the accelerometer version of the equation (13) of Estes et al uses data from one pair of orientations where the x-axis is approximately aligned and against the gravity vector, respectively. Similarly equation (14) of Estes et al uses data from another pair of orientations where the y-axis is approximately aligned and against the gravity vector, respectively. Other data points which have information on the misalignments are not used to achieve a high accuracy. The four orientations must be present for step (5) to work. In step (7) the equations (13) and (14) of Estes et al for magnetometers are used. It suffers from the similar limitations and restrictions as those of step (5).

Furthermore in step (7) the use of equations (13) and (14) of Estes et al. for magnetometers requires the horizontal components of the Earth's magnetic field to be constant when sensor data are taken at the orientations related to equations (13) and (14). Variations of both the Earth magnetic field's dip and declination can affect the calibration accuracy. This limits when the TFC method can be used. During periods of active magnetic field activity on Earth the calibration coefficients obtained using the current version of TFC is not accurate.

Figure 6:
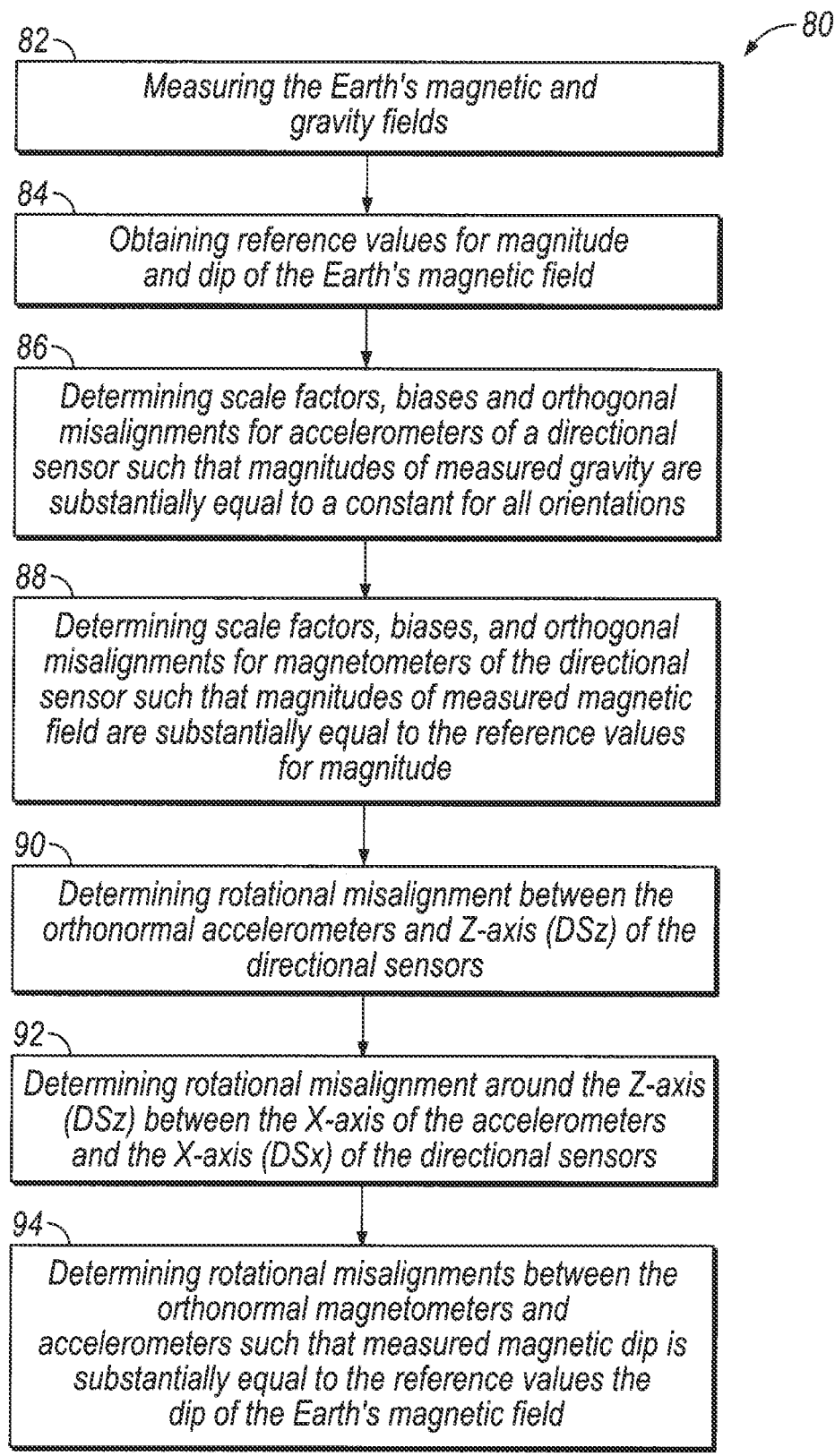
FIG. 6 illustrates a flow chart of an exemplary embodiment for calibrating a directional sensor in accordance with the present disclosure.

The presently disclosed system can be used to overcome the above-mentioned deficiencies. An exemplary embodiment of the presently disclosed system and method is shown in FIG. 6. FIG. 6 illustrates an exemplary embodiment of a flow chart 80 for calibrating a directional sensor 12 using the magnetometer system 16 in accordance with the present disclosure. The step 90 may be similar to step (5) mentioned above. However, in step 90 accelerometer data obtained at all sensor orientations from rotating the sensor system around its z axis are used. When all sensor orientations are used in the present disclosure, the inaccuracies associated with step (5) of the current method are greatly reduced. The limitations on where sensor has to point are thereby removed. In the present disclosure, there may not be a step in this exemplary embodiment that is similar to step (7) mentioned above because all three rotational misalignments of the magnetometers may be determined in a step 94. Using the calibration method of FIG. 6, in some embodiments, variation of the Earth's magnetic field during the calibration process does not affect the quality of calibration.

Magnetometer sensor outputs may be taken at several orientations. The orientations are obtained by rotating the sensor approximately around hardware x, y, and z axes, respectively. The axes of rotation are approximately horizontal and pointing approximately East-West. The orientations obtained from rotating the sensor around x axis form the x-rotational sequence or simply x sequence or x rotations; y and z rotations are similarly defined. The Earth's magnetic field magnitudes at the same time are also measured from an independent device and are recorded. They are called reference field measurements or simply references. The nine parameters in matrix L and vector $\vec{V}_0$ of equation (9) are determined by requiring the magnitudes of the magnetic field in equation (9) to match those of the reference as much as possible.

In some embodiments, magnetometer outputs at 24 orientations are collected with 8 orientations per axis performed for x, y, and z axes, respectively. Eight orientations are about 45 degrees apart and each of the two axes crossing from the rotating axis is aligned approximately with the magnetic field vector at one of the 8 orientations. When this setup is chosen, it is possible to use the simplified mathematics employed by Estes et al. with the assumption that all misalignments are small. The effect of each coefficient on the total field magnitude may be at a maximum at one or more orientations. Applying the total field magnitude constraint at those orientations yields the most accurate coefficient. The set of orientations may allow for sequential determination of a coefficient using data from one or a few orientations, as taught by Estes et al.

By using a more generalized parameter fitting approach such as the Method of Least Squares (MLS) all nine parameters in matrix L and vector $\vec{V}_0$ of equation (9) can be determined simultaneously with data from all orientations. Magnitude of the field at each orientation may be individually constrained by the reference at the time. One can have a set of 8 orientations from rotating around an axis with an offset from those of Estes et al. and the final result will be the same. Namely, it is possible that in none of 8 orientations where a cross-axis is aligned approximately with the magnetic vector. This is possible because at each of those orientations the effect on magnitude from a linear combination of coefficients may be maximized. Since all nine parameters are simultaneously determined or updated, different combinations of coefficients may be accurately determined implicitly. The accurate values of the combinations lead to accurate individual coefficients. The optimization algorithm such as MLS may not seek to find out what the combinations are explicitly. Accurate results may come out naturally if the number of orientations is large enough and the orientations are more or less uniformly spaced apart.

The number of orientations per rotational sequence is also flexible. More orientations may statistically result in a more accurate and/or precise determination of the calibration coefficients. It should be noted that the number of orientations may be such that the orientations are in a sequence and they are more or less equally spaced apart so that equal weights can be used in the squares. In any case the set of orientations used by Estes is among the very optimum choices.

When geomagnetic field changes rapidly during the calibration process the data sampling window may be small enough so that the field can be considered constant within the time interval. More than one sample may have to be taken at one orientation to have an effective large sampling window to minimize random noise. Each sample is considered an orientation by the algorithm. There may be more orientations than actual distinct orientations. This is easily handled by using a weighted least square method. Each residual term is weighted by the inverse of the square root of the sample window. The weight is also a function of angular separation between adjacent orientations. In the context of the present disclosure MLS may include both simple least squares and weighted least squares. MLS may also include the iterative approach in finding coefficients to minimize the squares.

The nine parameters in L and vector $\vec{V}_0$ for accelerometers are also determined in the same manner as those of magnetometers. The slight difference is that the gravity does not fluctuate and is a constant at a location. No measurement device for the reference value may be needed. In addition, in some embodiments for MWD applications, only the directional information of the measured gravity may be used for well orientation determination, the absolute scale factor common to all three accelerometers can be arbitrary. So generally, 1 g is often used as the reference where g is the average gravity on the surface of the Earth. The use of the precise value of the gravity at a calibration facility, is still preferable. With absolute scale factors, the magnitude of the measured gravity in a well can be compared with the local reference value as a check on the quality of the sensor system.

The rotational axes may be approximately perpendicular to the field vectors so that a full scale of the field is utilized for calibrating the scale factors and misalignments of the two sensor axes crossing from the axis of rotation. For the purpose of calibrating magnetometers the axis of rotation can be in any direction in a plane perpendicular to Earth's magnetic field vector. Similarly, for accelerometers the axis of rotation can be placed in any direction in the horizontal plane. Since horizontal East-West direction is at right angle with both gravity and Earth's magnetic fields it is convenient to have the axis of rotation for both types of sensors placed approximately along this direction. Magnetometer data at all orientations including those designed for accelerometers are used for calibrating magnetometers. Similarly, all accelerometer data are used for accelerometer calibration.

With the matrix L and vector $\vec{V}_0$ determined, an orthonormal frame for magnetometers is determined. Raw sensor output can now be converted into magnetic field components in this frame using equation (9). A separate orthonormal frame for accelerometers is also determined in a similar fashion. The two frames are in general not necessarily coincidental and may be different from the directional sensor frame.

In some embodiments, the sensor assembly is housed in a cylindrical structure. In the cylindrical structure, rotation around the z-axis is performed around the axis of the cylinder which is usually defined to be the Z axis of directional sensor frame. Unlike the x and y rotations, z rotations are carefully done around the cylinder axis so that the different orientations of z rotations are from rotations about a single axis. Namely wobbling of the axis may not be allowed for the z sequence. The restriction is only about the axis of rotation not moving, not about the axis pointing at a particular direction or precise angles of rotations. The no-wobbling restriction may not be used for determining the orthogonal misalignment coefficients in matrix L or vector Vo but may be for rotational misalignment parameters in R.

For accelerometers and in some embodiments, the gravity components along the sensor frame Z axis (the axis of the z-sequence) for z rotations must be constant. Using this fact two of the three parameters of R for accelerometers are determined. The two parameters specify the orientation of the directional Z axis in the orthonormal frame. They are related to the angles θ and φ in FIG. 5. Estes et al. use equations (13) and (14) in their paper to determine two misalignment coefficients. Constant z-component requirement at two orientations where x is approximately aligned along or against Earth's gravity vector is used to derive equation (13). Equation (14) is similarly derived using data at two orientations when y is along or against the gravity vector.

It is more robust in some embodiments to apply the constant z-component to all orientations in the z sequence. Using more data points may reduce random error. Additionally, reliance on x and y being along or against the field vector in the z rotations may be minimized. The amount of information on z axis rotational misalignment from any pair of orientations spaced 180 degrees apart may be the same as that of either of the two pairs used by Estes et al.

The two coefficients from equations (13) and (14) of Estes et al are not purely two parameters of matrix R. They are two elements of matrix M. By not factoring matrix M into a product of a purely rotational and an orthogonal misalignment matrices Estes et al. had to include equations (13) and (14) in their iterative processes. The application of the equations cause the magnitudes of measured field to change so that scale factors, biases, and other misalignment terms need to be updated again to accommodate the change. The factoring of matrix M allows one to determine the rotational misalignments separately from other coefficients in a single step.

Figure 5:
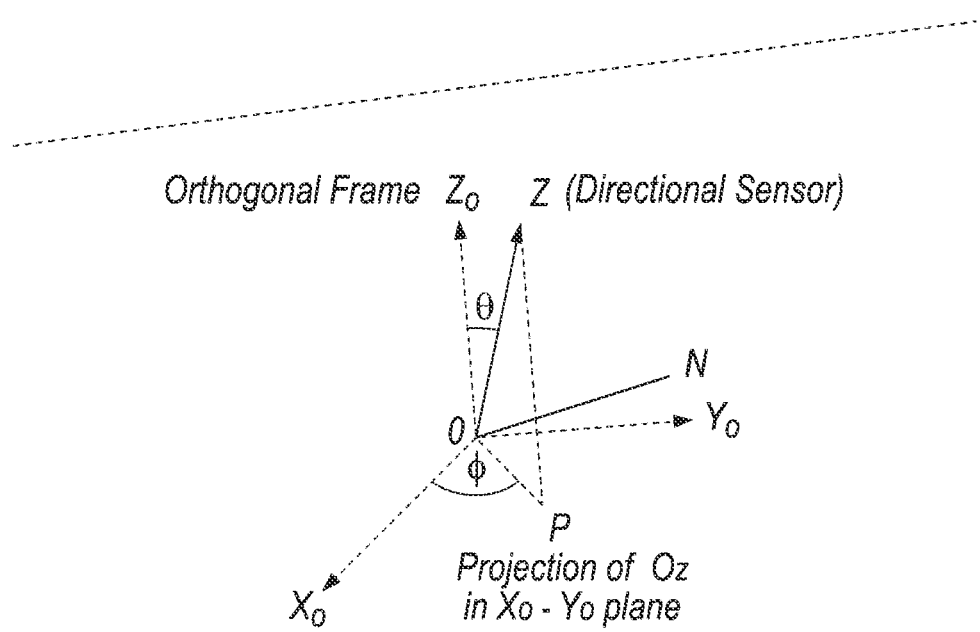
FIG. 5 illustrates a diagrammatic view of rotation misalignment between hardware axes of sensors and a Z-axis of a directional sensor system.

From FIG. 5 one can see that after pinpointing the orientation of Z axis the directional sensor frame is not determined. In some embodiments, to completely determine the directional sensor frame, where X or Y is pointing must be settled, the remaining parameter in R may be defined by requiring the directional sensor X axis to be in the plane of the Z-axis defined by the z rotations and the hardware x axis. This means that $M_{xy}$ (the first element of the second column in M) is zero. Setting $M_{xy}=0$ to define the directional sensor X axis is inaccurately referred to as "using the accelerometer hardware x axis as the directional sensor X-axis" or "accelerometer x is the X" in the industry.

In some embodiments, with the above definitions of the Z and X axes of the directional sensor frame, all 12 calibration coefficients for the accelerometers are completely determined. The Y axis of the directional sensor frame is also defined. It is at right angle with both X and Z and (X, Y, Z) form a right-hand coordinate system.

The z rotations for both accelerometers and magnetometers are performed around the same cylinder axis. With the magnetic components along z-sequence rotational axis for the z rotations constant, two of the three parameters in R for magnetometers are determined. The remaining parameter in R is determined by having the angles between $\vec{B}$ and $\vec{G}$ at several orientations constant. The angle between $\vec{B}$ and $\vec{G}$ is related to the dip of the Earth's magnetic field.

The gravitational field at a calibration location is extremely stable. The method of requiring the gravity components along the axis of rotation to be constant for the z rotations to determine the rotational misalignment between the orthonormal frame and Z axis of the directional sensor frame is very accurate.

If Earth's magnetic field is stable during the z rotations, then the z-axis for magnetometers determined in step (7) of the method mentioned above will be accurate and coincidental with that of accelerometers. If Earth's field changes during the z rotations, then the components along the axis of rotation for the z sequence are not constant. The Z-axis for magnetometers obtained through the above method is not accurate. The Z axes of the accelerometers and the magnetometers no longer align with each other. This misalignment is unknown. The directional information derived from the directional sensor measurements is in error. Since the axis of rotation for z rotations is approximately horizontal the variation of the surface components of the Earth's field is the main source of error causing rotational misalignment between accelerometers and magnetometers calibrated with the current method. The current version of TMC is effective and accurate when the magnitude and direction of the geomagnetic field is stable. The current version of TMC can't be used when the geomagnetic field changes rapidly.

When the reference values of dip of the Earth magnetic field are available, the present disclosure can be used to eliminate completely the effect of Earth field fluctuations during the calibration process. All 3 parameters in the rotational matrix R for the magnetometers may be determined by requiring the magnetic dip values from magnetic fields measured by the directional sensor to match those of the reference.

When the reference value of dip is not available the calibration can still be improved by the present disclosure. All 3 parameters in the rotational matrix R for the magnetometers may be determined by requiring the magnetic dip to be as constant as possible. The error source may be now limited to dip fluctuation only. In some embodiments, the declination variation or the magnitude change of the horizontal component of the Earth's field during calibration does not impact calibration quality.

When dip reference is available a sensor system can be accurately calibrated any time regardless how much the geomagnetic field changes. Even when dip reference is unavailable the error source is limited to dip fluctuation.

The present disclosure about determining the rotational misalignment between two orthogonal frames (i.e. orthonormal magnetometer axes and the directional sensor system defined by fully calibrated accelerometers) can be applied to systems where the scale factors, biases, and the orthogonal misalignments are determined with methods other than TMC. It also applies to sensors which are nonlinear. It applies to sensing systems where two vector fields (not necessarily gravity or magnetic field) are measured and the relative angle between the two fields is known or known to be nearly constant.

The factoring of matrix M makes it possible to separate twelve calibration parameters into groups of nine and three, respectively. The two groups can be determined with different methods. In one embodiment, the constraint of the reference values on magnitudes only applies to the parameters in the group of nine.

The rotational matrix R can be further factored into two matrices, $$R=R_x R_z, \quad (11)$$

where $R_z$ is a matrix that rotates the orthonormal frame into one where the z axis is aligned with Z axis of the directional sensor frame (the axis of rotation of the z sequence), $R_x$ is a rotation about the Z axis to move the orthonormal x axis after $R_z$ rotation into the plane of Z and the accelerometer hardware x axes. The three independent parameters in R are now grouped into two in $R_z$ and one in $R_x$. The parameters are determined in separate steps.

$R_z$ is not a rotation about the z axis, but one to align the z axis. $R_x$ is a rotation around Z to align the x axis. In some embodiments, the factoring of R is not unique. There are many ways to rotate the orthonormal z axis to align with the axis of rotation for the z sequence. All of them will result in Z axis in the desired position but different x and y directions. For each $R_z$ there is an $R_x$ that rotates the x axis into the correct position. Only the interim results of the axes are different. In some embodiments, the final result does not depend on how R is factored.

If the angle between the orthonormal z axis and the Z axis is θ and Z's projection in the Xo-Yo plane is at an angle of φ from Xo as shown in FIG. 5, then a rotation around ON in the figure by θ brings Zo to Z. ON is in the Xo-Yo plane and is perpendicular to OP. The rotational matrix corresponding to this rotation is $$R_z = \begin{pmatrix} \sin^2\Phi\cos^2\Phi\cos\theta & -\sin\Phi\cos\Phi(1-\cos\theta) & -\cos\Phi\sin\theta \\ -\sin\Phi\cos\Phi(1-\cos\theta) & \cos^2\Phi+\sin^2\Phi\cos\theta & -\sin\Phi\sin\theta \\ \cos\Phi\sin\theta & \sin\Phi\sin\theta & \cos\theta \end{pmatrix} \quad (12)$$

For θ≤90 degrees $R_z$ can be rewritten as $$R_z = \begin{pmatrix} 1 - \frac{n_x^2}{n_x^2+n_y^2}(1-n_z) & \frac{-n_x n_y}{n_x^2+n_y^2}(1-n_z) & -n_x \\ \frac{-n_x n_y}{n_x^2+n_y^2}(1-n_z) & 1 - \frac{n_y^2}{n_x^2+n_y^2}(1-n_z) & -n_y \\ n_x & n_y & n_z \end{pmatrix}, \quad (13)$$

where $n_x = \cos\phi\sin\theta$, $n_y = \sin\phi\sin\theta$, and $$n_z = \sqrt{1 - n_x^2 - n_y^2}.$$

The rotation about the Z-axis to align the x axis is $$R_x = \begin{pmatrix} \cos\varphi & \sin\varphi & 0 \\ -\sin\varphi & \cos\varphi & 0 \\ 0 & 0 & 1 \end{pmatrix}, \quad (14)$$

where φ is the angle of rotation.

The three parameters in the rotational matrix R are represented by $n_x$, $n_y$, and φ. The factoring of R is performed for magnetometers and accelerometers, respectively. So there are two sets of equations (13)-(14) and two sets of ($n_x$, $n_y$, φ). One is for magnetometers and the other for accelerometers.

For accelerometers $n_x$ and $n_y$ are determined by requiring the gravity component along the axis of rotation for z sequence, Gz, to be constant. $G_Z$ is the z component of $R_x R_z \vec{G}_{or}$. Since $R_x$ is a rotation about the z-axis it does not alter the z component of a vector it operates on. So $G_Z$ is also the z component of $R_z \vec{G}_{or}$ and is given by $$G_Z = n_x G_{or_x} + n_y G_{or_y} + n_z G_{or_z}. \quad (15)$$

Forcing $G_Z$ to be constant for the z sequence and assuming it is indeed a constant (no noise) lead us to $$\frac{n_x}{n_z} = \frac{(\overline{G_{or_y}G_{or_z}} - \overline{G_{or_y}}\,\overline{G_{or_z}})(\overline{G_{or_x}G_{or_y}} - \overline{G_{or_x}}\,\overline{G_{or_y}}) - (\overline{G_{or_x}G_{or_z}} - \overline{G_{or_x}}\,\overline{G_{or_z}})(\overline{G_{or_y}^2} - \overline{G_{or_y}}^2)}{(\overline{G_{or_x}^2} - \overline{G_{or_x}}^2)(\overline{G_{or_y}^2} - \overline{G_{or_y}}^2) - (\overline{G_{or_x}G_{or_y}} - \overline{G_{or_x}}\,\overline{G_{or_y}})^2}, \quad (16)$$

$$\frac{n_y}{n_z} = \frac{(\overline{G_{or_x}G_{or_z}} - \overline{G_{or_x}}\,\overline{G_{or_z}})(\overline{G_{or_x}G_{or_y}} - \overline{G_{or_x}}\,\overline{G_{or_y}}) - (\overline{G_{or_y}G_{or_z}} - \overline{G_{or_y}}\,\overline{G_{or_z}})(\overline{G_{or_x}^2} - \overline{G_{or_x}}^2)}{(\overline{G_{or_x}^2} - \overline{G_{or_x}}^2)(\overline{G_{or_y}^2} - \overline{G_{or_y}}^2) - (\overline{G_{or_x}G_{or_y}} - \overline{G_{or_x}}\,\overline{G_{or_y}})^2}, \quad (17)$$

where a bar above a variable name means averaging of the variable over the z sequence.

In some embodiments, equations (16) and (17) are valid for all possible values of $n_x$ and $n_y$ if the noise is negligible. With the presence of noise, $G_Z$ is not perfectly constant. It can be proven that minimizing the variance of $G_Z$ over the z sequence and dropping terms explicitly second or higher orders in $n_x$ and $n_y$ will give us two equations very similar to equations (16) and (17). The only extra term is $$\left(\overline{G_{or_z}^2} - \overline{G_{or_z}}^2\right)$$

which is implicitly second order in $n_x$ and $n_y$. So for small $n_x$ and $n_y$ equations (16) and (17) minimize $G_Z$ variance over z sequence. Small $n_x$ and $n_y$ means that hardware axes are very near those of the directional sensor frame. In theory iterations maybe needed to achieve a required accuracy. In reality only one iteration is needed.

From the definition of $n_z$:

$$n_x = \left(\frac{n_x}{n_z}\right)\frac{1}{\sqrt{\left(\frac{n_x}{n_z}\right)^2 + \left(\frac{n_y}{n_z}\right)^2 + 1}}, \quad (18)$$

$$n_y = \left(\frac{n_y}{n_z}\right)\frac{1}{\sqrt{\left(\frac{n_x}{n_z}\right)^2 + \left(\frac{n_y}{n_z}\right)^2 + 1}}. \quad (19)$$

Equations (16) and (17) give us $$\frac{n_x}{n_z}$$

and $$\frac{n_y}{n_z}.$$

$R_z$ can now be determined as follows.
$R_x$ is determined by setting $M_{xy}=0$.
Let $C = R_z L$. Then $M_{xy}=0$ gives us $$\cos\varphi C_{xy} + \sin\varphi C_{yy} = 0. \quad (20)$$

The solution where $|\varphi| \leq 90$ degrees is $$\varphi = \text{ATAN}\left(-\frac{C_{xy}}{C_{yy}}\right). \quad (21)$$

The $|\varphi|>90$ solution is not correct for systems where x accelerometer is placed near its desired position.

In some embodiments, all 12 calibration coefficients for accelerometers are now completely determined. The gravity vector in the directional sensor frame is $$\vec{G} = R_x R_y \vec{G}_{or}. \quad (22)$$

For magnetometers, $(n_x, n_y, \varphi)$ are determined by setting the magnetic dip at each orientation to match the reference value for all orientations. The three parameters are determined simultaneously in a single step. The magnetic component along the axis of rotation for the z sequence being constant is no longer an input to the calibration process.

The rotational misalignment in the plane of magnetic vector and gravity vector (GBP) between the magnetometer frame and that of accelerometer is an azimuthal misalignment about the horizontal magnetic East-West (HEW). This misalignment, if uncorrected, causes measured magnetic dip to be different from the true dip by an amount equal to the misalignment. In some embodiments, by forcing the measured dip to match that of the reference, the misalignment is correctly determined. For z sequence, the Z axis is placed near HEW and x-y plane is near GBP. The dip constraint on those results in the determination of the misalignment between the magnetic x-y axes and those of accelerometers rotationally about z axis. Similarly x and y rotations are used to determine the misalignments rotationally about x and y axes, respectively. For the purpose of determining the rotational misalignments between magnetometers and accelerometers it may not be necessary to place the directional sensor's X, Y, and Z near HEW. Data from orientations where the x, y, and z from any orthogonal frame are placed near HEW can be used to determine the total misalignments between the two frames. In some embodiments, data from all orientations may be used to determine the three rotational misalignments simultaneously so that the algorithm does not have to figure out which set of data is used for which misalignment.

The magnetic dip at the i-th orientation is $$d_i = \text{ASIN}\left[\vec{G} \cdot \left(R_x R_z \vec{B}_{or}\right) / |\vec{G}||\vec{B}_{or}|\right], \quad (23)$$

where $\cdot$ is the operator for dot product, $R_x$ and $R_z$ are the rotational matrices for magnetometers. Let $d_i^{ref}$ be the reference value of dip during the i-th orientation. Then $(n_x, n_y, \varphi)$ is chosen to minimize the functional $$\sum_{i=1}^{N}(d_i - d_i^{ref})^2, \quad (24)$$

where N is the number of total orientations. It is sometimes more advantageous to minimize dip drift difference than dip difference. The drift difference functional is $$\sum_{i=2}^{N}[d_i - d_1 - (d_i^{ref} - d_1^{ref})]^2. \quad (25)$$

For reference values, in some embodiments, drift of the magnetic dip may be monitored rather than measuring the absolute value of dip. Furthermore when reference values are not available, the functional in equation (25) by setting $(d_i^{ref}-d_1^{ref})=0$ for all i's can be used. In this example, the measured dip may be required to be as constant as possible. The algorithm and software based on minimizing the functional in equation (25) to determine $(n_x, n_y, \varphi)$ can be used with or without dip reference values.

There are many parameter systems for representing a rotation in a 3-dimensional Euclidian space. A set of 3 proper Euler angles are often used. However, when the rotational misalignments between the two frames are small all three parameters in $(n_x, n_y, \varphi)$ are small. This is not the case for Euler angles. To minimize the functional in equation (25), a brute force search method for finding the solutions can be used because of the small parameter space. This is how $(n_x, n_y, \varphi)$ is determined in some embodiments of the present disclosure.

It is possible that for some reasons hardware axes of accelerometers are not aligned nominally with those of magnetometers by design. In that case the magnetometers or accelerometers are transformed first by the nominal misalignment. Then the residual rotational misalignment is parameterized by $(n_x, n_y, \varphi)$. The parameters in this set are small. It is also possible that two sets of hardware axes are near each other, but are misaligned with the directional sensor frame by an appreciable amount. In some embodiments, after the accelerometers are fully calibrated, the rotational misalignment between the accelerometer frame and the orthonormal magnetometer frame is not small. In that case $\vec{B}_{or}$ may be replaced by $R(\vec{G})\vec{B}_{or}$ in computing the dip angle $d_i$ where $R(\vec{G})$ is the rotational matrix for the accelerometers. Namely the magnetometer frame is transformed first by the rotation that brought the orthonormal accelerometer frame to that of the directional sensor. Then $(n_x, n_y, \varphi)$ in $R_x$ and $R_z$ for magnetometers may be used for the remaining rotational misalignment between the magnetometers and accelerometers. This step is optional, but it is advantageous to always take this step to ensure that the yet to be determined rotational misalignment is indeed very small. However, in certain instances, this step is not needed and its effect is negligible. When this step is needed it is there. The total rotation for transforming the orthonormal magnetometer frame into that of the directional sensor is $R_x R_z R(\vec{G})$.

Because the magnetic components along the axis of rotation for the z sequence are not constrained to be constant, the fluctuations of the horizontal component of the geomagnetic field may not directly impact the quality of calibration. As long as the reference values of dip drift are available for all orientations, the calibration can take place any time. Even when dip reference is unavailable the quality of calibration using the method of the present disclosure is often higher than that of the prior art. In this case the quality of the calibration may be impacted by the unknown dip variation, not by declination or the magnitude of the horizontal component of the Earth's field. The magnetic dip fluctuation of the Earth's field is often smaller than that of declination.

From the above description, it is clear that the inventive concept(s) disclosed herein are well adapted to carry out the objects and to attain the advantages mentioned herein, as well as those inherent in the inventive concept(s) disclosed herein. While the embodiments of the inventive concept(s) disclosed herein have been described for purposes of this disclosure, it will be understood that numerous changes may be made and readily suggested to those skilled in the art which are accomplished within the scope and spirit of the inventive concept(s) disclosed herein. For example, the functional in equation (25) may be modified by replacing the index 1 by i–1 for d and $d^{ref}$.

What is claimed is:

1. A system for calibrating a directional sensor system having two sets of field sensors, the system comprising:
    a computer system communicating with the directional sensor system, the computer system executing calibration software and reading:
        at least one data table storing measured first field values indicative of a first vector field sensed by a first set of field sensors of the directional sensor system in at least three sensor orientations;
        at least one data table storing measured second field values indicative of a second vector field sensed by a second set of field sensors of the directional sensor system in at least three sensor orientations, a relative angle between the first vector field and the second vector field being known or known to be nearly constant; and
    wherein the calibration software executed by the computer system determines rotational misalignments between the first set of field sensors of the directional sensor system and the second set of field sensors of the directional sensor system.

2. The system of claim 1, wherein the rotational misalignments between the first set of field sensors of the directional sensor system and the second set of field sensors of the directional sensor system are determined such that measured angles between each set of field sensors are substantially constant for the at least three sensor orientations.

3. The system of claim 1, further comprising a thermometer in communication with the computer system, wherein the computer system reads at least one data table storing temperature data from the thermometer, wherein calibration coefficients for the directional sensor system are determined at a specific temperature reading.

4. The system of claim 3, further comprising a calibration stand for positioning and orienting the directional sensor system.

5. The system of claim 1, wherein measured first field values and measured second field values of the directional sensor system are obtained in at least nine directional sensor orientations including at least three orientations wherein the directional sensor is rotated about a Z-axis of the directional sensor system, and the calibration software executed by the computer system determines calibration coefficients for the directional sensor system such that measured field components along the axis of rotation are substantially constant among the at least three orientations.

6. The system of claim 1, wherein measured first field values and measured second field values of the directional sensor system are obtained in at least nine directional sensor orientations, and the calibration software executed by the computer system determines calibration coefficients for the directional sensor system.

7. A method of calibrating a directional sensor having two sets of field sensors, comprising:
    measuring data indicative of two field vectors with the two sets of field sensors in a plurality of sensor orientations;
    receiving data, by a computer system, indicative of the two field vectors in the plurality of sensor orientations of the directional sensor; and
    calibrating the directional sensor by the computer system, by:
        determining and applying rotational misalignments between the field sensors so that measured angles between the field vectors are substantially equal to a constant for the plurality of orientations.

8. The method of claim 7 further comprising using a method of least squares to determine the rotational misalignments between the field sensors.

9. The method of claim 7, wherein measurement axes of the field sensors are intentionally aligned with each other.

10. The method of claim 7, wherein measurement axes of the field sensors are intentionally offset with each other.

11. The method of claim 7 wherein calibration of the directional sensor occurs while the directional sensor is positioned on a calibration stand.

12. The method of claim 11, wherein the calibration stand includes a housing configured to orient the directional sensor in a plurality of direction about a first axis such that the housing is configured for rotational movement about the first axis and the directional sensor is oriented in any direction within 360 degrees about the first axis.

13. The method of claim 11, wherein the housing is attached to a platform configured to move in a plurality of directions about a second axis such that the platform is configured to rotate about the second axis and the directional sensor is oriented in any direction about the second axis.

14. The method of claim 11, wherein the calibration stand includes a temperature applicator.

15. The method of claim 14, wherein the temperature applicator is configured to alter temperature of the directional sensor.

16. The method of claim 15, wherein the temperature applicator is a blanket surrounding the directional sensor and configured to increase the temperature of the directional sensor.

17. The method of claim 15, wherein the temperature applicator includes a thermometer configured to measure and record the temperature of the directional sensor and the temperature applicator is configured to increase the temperature of the directional sensor.

* * * * *